(12) United States Patent
Kim et al.

(10) Patent No.: US 7,504,195 B2
(45) Date of Patent: Mar. 17, 2009

(54) PHOTOSENSITIVE POLYMER AND PHOTORESIST COMPOSITION

(75) Inventors: Deog-Bae Kim, Hwaseong-Si (KR); Jae-Hyun Kim, Hwaseong-Si (KR)

(73) Assignee: Dongjin Semichem Co., Ltd., Incheon (KR)

( * ) Notice: Subject to any disclaimer, the term of this patent is extended or adjusted under 35 U.S.C. 154(b) by 0 days.

(21) Appl. No.: 11/836,599

(22) Filed: Aug. 9, 2007

(65) Prior Publication Data

US 2008/0057436 A1   Mar. 6, 2008

(30) Foreign Application Priority Data

Aug. 10, 2006   (KR) ...................... 10-2006-0075896

(51) Int. Cl.
*G03F 7/004*   (2006.01)
*G03F 7/30*   (2006.01)

(52) U.S. Cl. .................... 430/270.1; 430/326; 430/905; 430/910; 526/262

(58) Field of Classification Search ............. 430/270.1, 430/326, 905, 910; 526/262
See application file for complete search history.

(56) References Cited

U.S. PATENT DOCUMENTS

| 5,594,086 | A * | 1/1997 | Vicari .......................... 526/262 |
| 7,410,746 | B2 * | 8/2008 | Sakayori ................... 430/270.1 |
| 2003/0118942 | A1 * | 6/2003 | Mitsumoto et al. ....... 430/284.1 |

\* cited by examiner

*Primary Examiner*—John S Chu

(74) *Attorney, Agent, or Firm*—Birch, Stewart, Kolasch & Birch, LLP

(57) ABSTRACT

A photosensitive polymer which can form a fine circuit pattern by exacting with extreme UV and deep UV, and can improve a line width stability of a pattern by significantly reducing line edge roughness after developing, and a photoresist composition including the same are disclosed. The photosensitive polymer for extreme UV and deep UV includes a repeating unit represented by the following Formula 1,

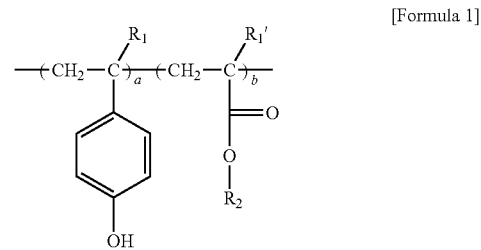

[Formula 1]

in Formula 1, $R_1$ and $R_1'$ are independently a hydrogen atom, methyl group, or trifluoromethyl group, and $R_2$ is

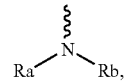

wherein Ra and Rb are independently alkyl group of 1 to 10 carbon atoms, aryl group of 6 to 10 carbon atoms, or arylalkyl group of 7 to 12 carbon atoms, and can be connected together to form ring, and a and b are mol % of each repeating unit with respect to the total repeating unit constituting the photosensitive polymer, and are 1 to 99 mol % and 1 to 99 mol % respectively.

12 Claims, 2 Drawing Sheets

PHOTOSENSITIVE POLYMER AND PHOTORESIST COMPOSITION

This application claims the priority benefit of Korean Patent Application No. 10-2006-0075896 filed on Aug. 10, 2006. All disclosure of the Korean Patent application is incorporated herein by reference.

FIELD OF THE INVENTION

This invention relates to a photosensitive polymer and a photoresist composition including the same. More specifically, this invention relates to a photosensitive polymer which can form a fine circuit pattern by reacting with extreme UV and deep UV, and can improve a line width stability of the pattern by significantly reducing line edge roughness(LER) after developing, and a photoresist composition including the same.

BACKGROUNDS OF THE INVENTION

As the integration degree of a semiconductor integrated circuit increases, there is a need for forming a fine pattern which cannot be formed by the conventional I-line ($\lambda$=365 nm), KrF ($\lambda$=248 nm), and ArF ($\lambda$=193 nm) exposure techniques. For example, as a dynamic random access memory ("DRAM") having a memory capacity of more than one gigabit has been developed, it is needed to produce a fine pattern having a higher resolution. To produce the fine pattern, various Next Generation Lithography (NGL) techniques have been actively studied, and Extreme UV lithography (EUVL) is developed as one of the NGL techniques.

Generally, in the photolithography process for manufacturing a semiconductor, a photoresist composition works as follows. (a) A photoresist layer formed on a semiconductor substrate is exposed to an exposure light through a photomask (reticle) on which a semiconductor circuit design is engraved, and thereby a latent image of the photomask is projected to the photoresist layer; (b) the photoresist layer to which the latent image of the photomask is projected, is baked to activate acids in the exposed parts; (c) a main chain or a functional group of a matrix photosensitive polymer for photoresist is depolymerized or deprotected, or a matrix photosensitive polymer is cross-linked; (d) accordingly, the difference of solubility for a developer between the exposed and the unexposed parts increases; and (e) a photoresist pattern is formed by successive processes such as a developing process.

To form a fine photoresist pattern whose line width is less than 0.25 μm, deep ultra violet light of a short wavelength of less than 250 nm is used as the exposure light in the lithography process, and KrF ($\lambda$=248 nm) or ArF ($\lambda$=193 nm) excimer laser is used as the exposure light source. The photoresist composition should (a) have a good transparency for the exposure light; (b) have a good adhesiveness to a substrate; (c) have a good etch resistance; (d) cause no damages or defects such as Line Edge Roughness (LER), top loss, slope in the formed photoresist pattern; (e) be easily developed in a conventional developer, for example 2.38 weight % tetramethylammonium hydroxide (TMAH) solution; and (f) have a good thermal stability. The resolution or photosensitivity of the photoresist does not much effected by the thermal properties of the photoresist, but the thermal properties of the photoresist are important properties in handling the photoresist during the lithography processes. For example, the produced photoresist pattern is used as a mask in processes such as etching, ion injecting. Accordingly, the developed photoresist pattern should be reinforced by a thermal treatment so as to endure the severe conditions of the etching or ion injecting process. When a photoresist pattern is heated in a high temperature, the polymer resin of the photoresist is cross-linked, and then molecular weight of the polymer increases, and chemical resistance and thermal resistance of the polymer improves. However, when a photoresist pattern is heated in a very high temperature or the thermal property of the polymer resin is not good, the photoresist pattern collapses or flows before being hardened.

SUMMARY OF THE INVENTION

Therefore, it is an object of the present invention to provide a photosensitive polymer for improving a line width stability of a pattern under an exposure light of extreme UV and deep UV, and a photoresist composition including the same.

It is another object of the present invention to provide a method of preparing the photosensitive polymer and a method of forming a photoresist pattern with the photoresist composition.

To accomplish these and other objects, the present invention provides a photosensitive polymer for extreme UV and deep UV including a repeating unit represented by the following Formula 1,

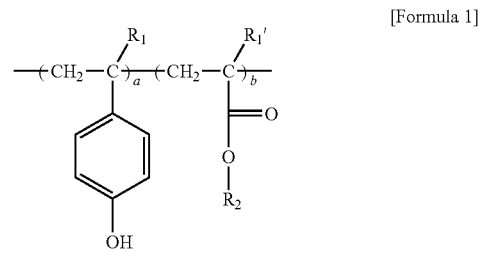

[Formula 1]

in Formula 1, $R_1$ and $R_1'$ are independently a hydrogen atom, methyl group, or trifluoromethyl group, and $R_2$ is

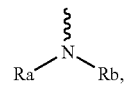

wherein Ra and Rb are independently alkyl group of 1 to 10 carbon atoms, aryl group of 6 to 10 carbon atoms, or arylalkyl group of 7 to 12 carbon atoms, and Ra and Rb can be connected together to form a ring, and a and b are mol % of each repeating unit with respect to the total repeating unit constituting the photosensitive polymer, and are 1 to 99 mol % and 1 to 99 mol % respectively. Also, the present invention provides a photoresist composition including the photosensitive polymer and a method of forming a photoresist pattern using the same.

DETAILED DESCRIPTION OF THE INVENTION

Figure 1:
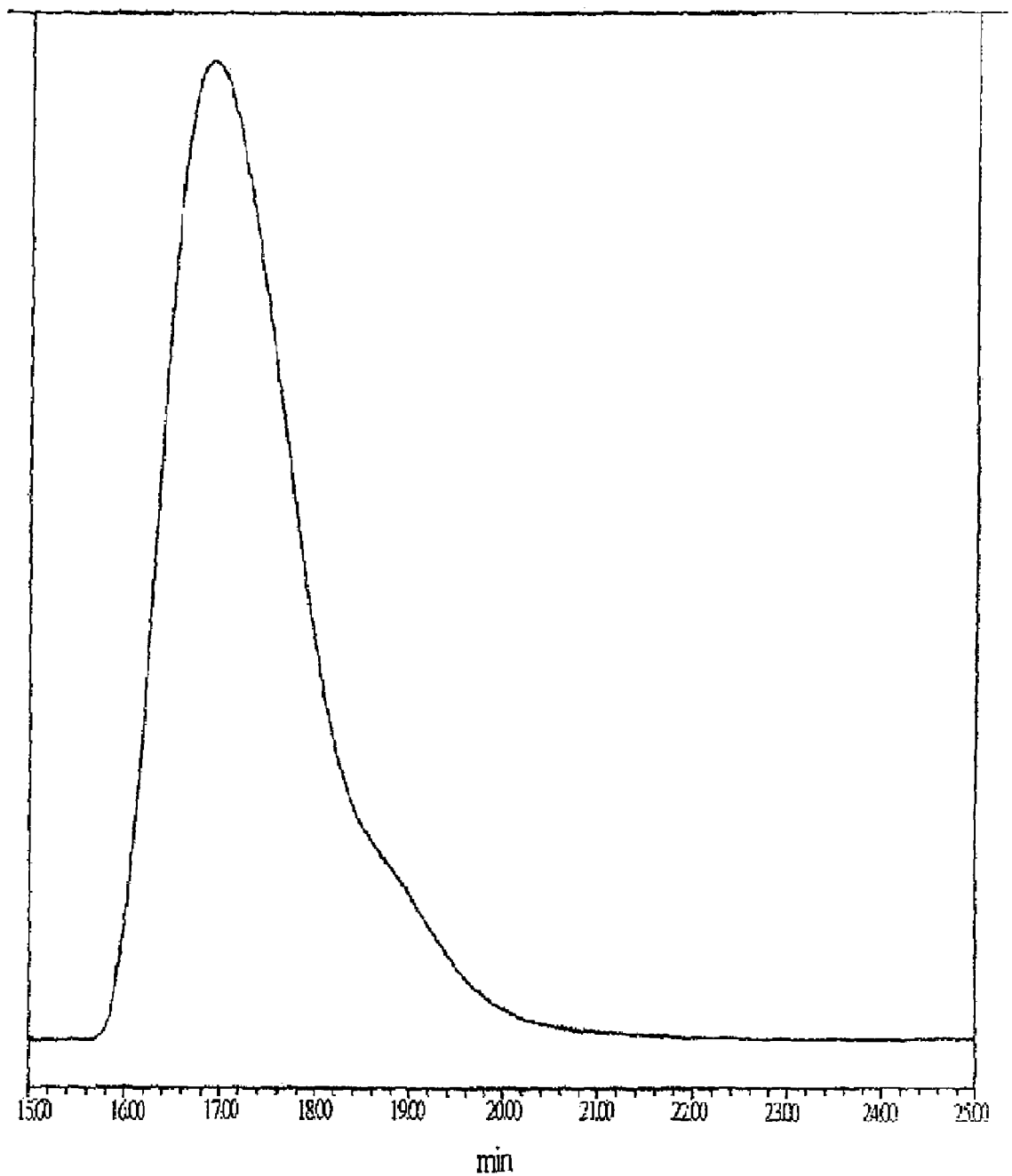
FIGS. 1 and 2 are GPC (Gel Permeation Chromatography) graphs of the photosensitive polymer according to an embodiment of the present invention.

A more complete appreciation of the invention, and many of the attendant advantages thereof, will be better appreciated by reference to the following detailed description.

A photosensitive polymer for extreme UV and deep UV according to the present invention includes a repeating unit represented by the following Formula 1.

[Formula 1]

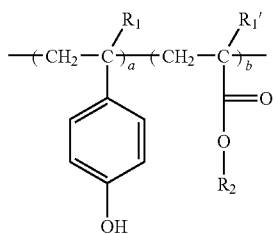

In Formula 1, $R_1$ and $R_1'$ are independently a hydrogen atom, methyl group, or trifluoromethyl group, and $R_2$ is

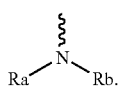

Ra and Rb are independently alkyl group of 1 to 10 carbon atoms, aryl group of 6 to 10 carbon atoms, or arylalkyl group of 7 to 12 carbon atoms, and can be connected together to form a ring. Also, a and b are mol % of each repeating unit with respect to the total repeating unit constituting the photosensitive polymer, and are 1 to 99 mol % and 1 to 99 mol % respectively. Here, the spiral line ( ~~~ ) means a connecting bond. Preferable examples of $R_2$ include oxime derivatives such as

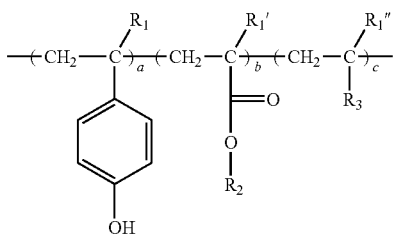

and so on.

Preferable examples of the photosensitive polymer according to the present invention can be represented by the following Formula 2, and more preferable examples can be represented by the following Formula 2a or 2b.

[Formula 2]

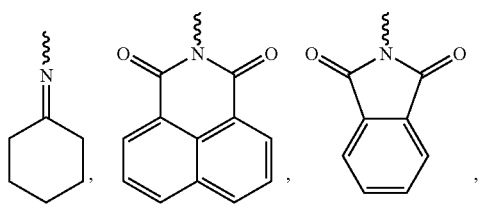

In Formula 2, $R_1$, $R_1'$ and $R_2$ are same as defined in Formula 1, and $R_1''$ is a hydrogen atom, methyl group, or trifluoromethyl group, and $R_3$ is hydrocarbon group of 4 to 22 carbon atoms or ester group, and a, b and c are mol % of each repeating unit with respect to the total repeating unit constituting the photosensitive polymer, and are 1 to 98 mol %, 1 to 98 mol %, and 1 to 98 mol % respectively.

In case that $R_3$ is hydrocarbon group, preferable examples of $R_3$ include benzene derivatives such as

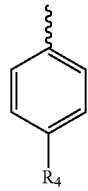

(here, $R_4$ is a hydrogen atom or alkyl group of 1 to 10 carbon atoms, and for example, can be methyl group, t-butyl group, —$C(CH_2CH_3)_3$, or so on.), or phenol derivatives such as

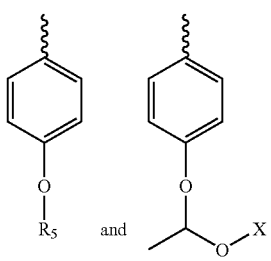

(here, $R_5$ is alkyl group of 1 to 10 carbon atoms, and for example, can be t-butyl group, —$C(CH_2CH_3)_3$, —$C(CH_3CHCH_3)_3$, and so on, and X is alkyl group of 1 to 10 carbon atoms or aryl group of 6 to 10 carbon atoms, and for example, can be methyl, ethyl, isopropyl, t-butyl, cyclohexyl, benzene, or so on). Also, in case that $R_3$ is ester group, $R_3$ can be represented by

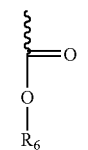

(here, $R_6$ is hydrocarbon group of 3 to 21 of carbon atoms), and, for example, can be

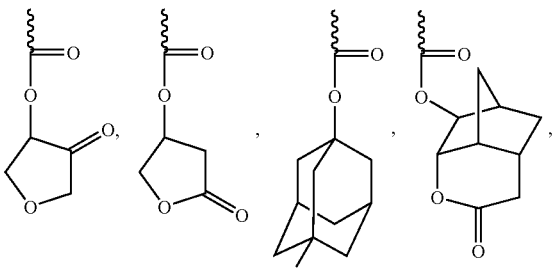

-continued

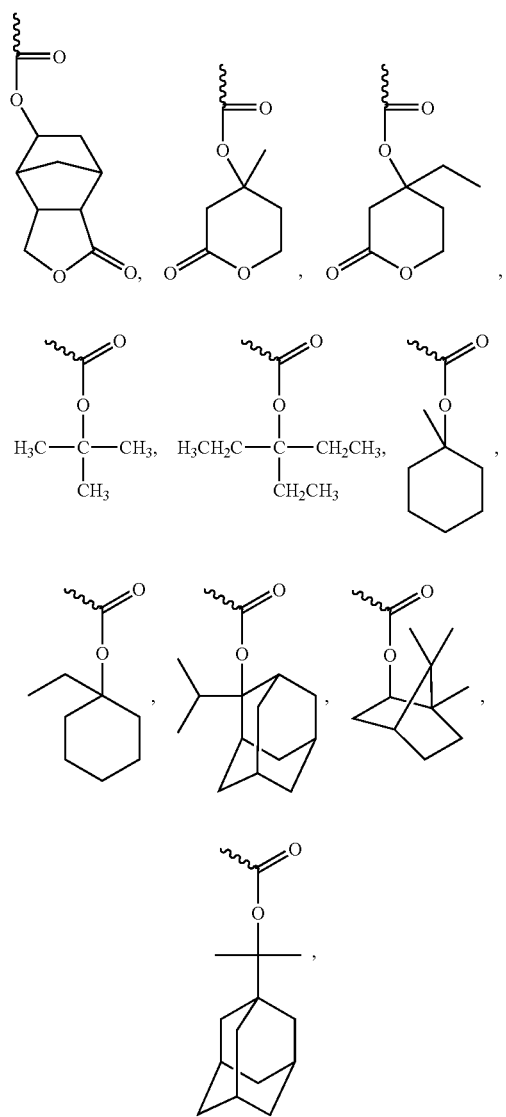

or so on.

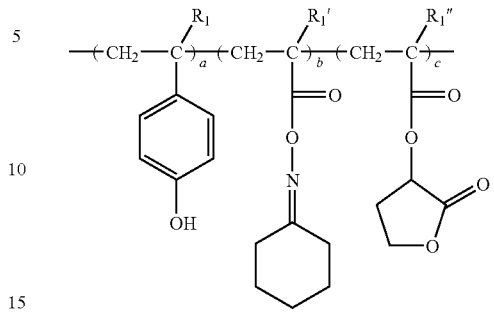

In Formulas 2a and 2b, $R_1$, $R_1'$, $R_1''$, a, b, and c are same as defined in Formula 2.

The photosensitive polymer represented by Formula 1 according to the present invention can be a block copolymer or a random copolymer, and has the weight average molecular weight (Mw) of 3,000 to 100,000, and preferably, of 3,000 to 30,000, and polydispersity (Pd) of 1.01 to 3.0 preferably. If the weight average molecular weight and the polydispersity thereof are beyond the above ranges, the physical property of a photoresist layer can be deteriorated, it is difficult to form a photoresist layer, or a pattern contrast will be lowered. The photosensitive polymer according to the present invention has a deprotecting group, which can be dissolved in a developing solution by photo reactions, and improves a line width stability of a pattern.

The conventional resist, which is chemically amplified to improve the photosensitivity, works as follows. When acids are generated from a photo-acid generator (PAG) by a light exposure, the generated acids work as a catalyst for the chemical deprotection reaction during the Post Exposure Bake (PEB) process, and thereby amplify the deprotection reaction. Thus, the solubility difference between the exposed and the unexposed parts is also amplified. Accordingly, the line width stability of a pattern largely depends on the acid diffusion in the exposed parts. On the other hand, in the photosensitive polymer according to the present invention, the acid diffusion is not a major mechanism for the deprotection reaction. In the present invention, the protecting group connected to the photosensitive polymer is directly dissociated by a photo-chemical reaction. Due to the dissociation of the protecting group, the polymer becomes soluble in an alkali solution, and the solubility difference between the exposed and the unexposed parts increases. Thus, the line width stability of a pattern can be improved in the present invention. In the present invention, the dissociation reaction is carried out on the N—O bond in the monomer having $R_2$. Namely, the N—O bond is directly decomposed by the supplied light energy in the present invention.

The photosensitive polymer according to the present invention can be prepared by the steps of (a) dissolving monomers represented by the following Formulas 3, 4, and 5 in a polymerization solvent, (b) adding a polymerization initiator to the mixed solution, and (c) reacting the mixed solution with a polymerization initiator under a nitrogen or argon atmosphere at a temperature of 60 to 70° C. for 4 to 24 hours. Preferably, the polymerization can be carried out by a radical polymerization reaction, a solution polymerization reaction, a bulk polymerization reaction or a polymerization reaction using a metal catalyst. Also, the preparation method may further include the step of crystallizing and purifying the product of reaction (c) with diethyl ether, hexane, petroleum ether, methanol, a lower alcohol (for example, ethanol or isopropanol), water, the mixtures thereof, and so on.

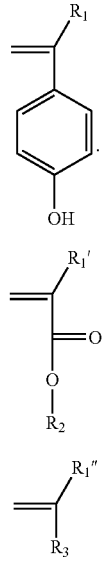

[Formula 3]

[Formula 4]

[Formula 5]

In Formulas 3, 4, and 5, $R_1$, $R_1'$, $R_1''$, $R_2$, and $R_3$ are same as defined in the Formula 2.

As the polymerization solvent, conventional various polymerization solvents can be used. Exemplary polymerization solvents include, but are not limited to, cyclohexanone, cyclopentanone, tetrahydrofuran, dimethylformamide, dimethylsulfoxide, dioxane, methylethylketone, benzene, toluene, xylene, and the mixtures thereof. The polymerization initiator also can be selected from conventional various polymerization initiators. Exemplary polymerization initiators include benzoylperoxide, 2,2'-azobisisobutyronitrile(AIBN), acetylperoxide, lauyl peroxide, t-butylperacetate, t-butylhydroperoxide, di-t-butylperoxide and the mixtures thereof.

The photoresist composition according to the present invention includes the photosensitive polymer including the repeating unit of the Formula 1 and an organic solvent. If necessary, the photoresist composition may further include a photo-acid generator and various additives. The amount of the photosensitive polymer including the repeating unit of Formula 1 is preferably 0.1 to 30 weight %, and more preferably 1 to 15 weight % with respect to the total amount of the photoresist composition. If the amount of the photosensitive polymer is less than 0.1 weight %, the formation of pattern having desired thickness is in trouble because the resist layer becomes too thin after being coated. If the amount of the photosensitive polymer is more than 30 weight %, the uniformity of the coating layer may be deteriorated.

The remaining component of the photoresist composition according to the present invention is the organic solvent. The organic solvent can be selected from various solvents which are conventionally used for the preparation of a photoresist composition. Exemplary organic solvents include, but are not limited to, ethyleneglycol monomethylethyl, ethyleneglycol monoethylether, ethyleneglycol monomethylether, diethyleneglycol monoethylether, propyleneglycol monomethyletheracetate (PGMEA), toluene, xylene, methylethylketone, cyclohexanone, ethyl-2-hydroxy propionate, ethyl 2-hydroxy-2-methyl propionate, ethoxyethyl acetate, hydroxyethyl acetate, methyl 2-hydroxy-3-methylbutanoate, methyl 3-methoxy-2-methylpropionate, ethyl 3-ethoxy propionate, ethyl 3-methoxy-2-methylpropionate, ethyl acetate, butyl acetate and the mixtures thereof.

Also, the photoresist composition according to the present invention may further include a photo-acid generator, if necessary. The photo-acid generator produces an acid component such as $H^+$ when exposed to a light source, so induces a chemical amplification reaction. As the photo-acid generator, any compound which can generate an acid component when exposed to light, can be used. Preferable examples of the photo-acid generator include sulfonium compound such as organic sulfonic acid, onium compound such as onium salt, and the mixtures thereof. The non-limiting examples of the photo-acid generator include phthalimidotrifluoromethane sulfonate having a low light absorbance at 157 nm and 193 nm, dinitrobenzyltosylate, n-decyl disulfone, naphthylimido trifluoromethane sulfonate, diphenyliodonium hexafluorophosphate, diphenyliodonium hexafluoroarsenate, diphenyliodonium hexafluoroantimonate, diphenylparamethoxyphenylsulfonium triflate, diphenylparatoluenylsulfonium triflate, diphenylparaisobutylphenylsulfonium triflate, triphenylsulfonium hexafluoroarsenate, triphenylsulfonium hexafluoro antimonate, triphenylsulfonium triflate, dibutylnaphthylsulfonium triflate and the mixtures thereof. The amount of the photo-acid generator is preferably from 0.1 to 20 weight parts for 100 weight parts of the photosensitive polymer. If the amount of the photo-acid generator is less than 0.1 weight part, the deprotection of the protection group be may in trouble because the sensitivity of the photoresist composition decreases. If the amount of the photo-acid generator is more than 20 weight part, the profile of the resist pattern may be deteriorated because a large quantity of acid is generated from the photo-acid generator.

If necessary, the photoresist composition according to the present invention may further include an organic base. Exemplary organic bases include, but are not limited to, triethylamine, triisobutylamine, triisooctylamine, diethanolamine, triethanolamine and the mixtures thereof. The amount of the organic base is preferably from 0.01 to 10 weight part with respect to 100 weight part of the photosensitive polymer. If the amount of the organic base is less than 0.01 weight part, the undesirable T-top phenomenon may be occurred at the resist pattern. If the amount of the organic base is more than 10 weight part, the pattern forming rate may be lowered because the sensitivity of photoresist composition decreases.

The photoresist composition according to the present invention can be prepared by mixing the photosensitive polymer, the organic solvent, if necessary the photo-acid generator, and various additives, and filtering the mixtures thereof, if necessary.

In order to form a photoresist pattern with the photoresist composition according to the present invention, the following conventional photolithography process can be carried out. First, the photoresist composition is applied on a substrate such as silicon wafer, an aluminum substrate, and so on, for example, with a spin coater to form a photoresist layer. Subsequently, a predetermined photoresist pattern is formed by exposing a light to the photoresist layer. After the exposure, if necessary, the photoresist pattern is thermally treated (Post Exposure Bake: PEB) and is developed. The prepared photoresist pattern is used to produce a semiconductor having a predetermined circuit patterns. As the light source for the exposure process, KrF, ArF, $F_2$, EUV (Extreme Ultra Violet), VUV (Vacuum Ultra Violet), E-beam, X-beam, Immersion lithography, or ion-beam can be used, and it is preferable that the exposure process is carried out under exposure energy of 1 to 100 mJ/cm². Also, as the developing solution for the developing process, alkali solution including alkali compounds such as sodium hydroxide, potassium hydroxide, sodium carbonate, tetramethylammonium hydroxide (TMAH) of the concentration of 0.1 to 10 weight % can be used. If necessary, the developing solution may further include water-soluble organic solvent such as methanol, ethanol and a surfactant. After the developing process, the cleaning process of the substrate can be further carried out, in which the substrate is washed with purified water.

Hereinafter, the preferable examples are provided for better understanding of the present invention. However, the present invention is not limited to the following examples.

EXAMPLE 1-1

Preparation of Photosensitive Polymer of Formula 2a

A) Preparation of Monomer of the Following Formula 6a

As a solvent, 200 g of tetrahydrofuran (THF) was added into a 500 ml 4-neck flask equipped with a mechanical stir. 63.96 g (0.3 mol) of N-hydroxy-1,8-naphthalimide was injected, and 31.37 g (0.31 mol) of triethylamine was slowly added, and then the mixed solution was stirred for 10 minutes at room temperature. After stirring, 32.41 g of methacyloyl chloride was slowly added into the solution at a temperature of less than 20° C., and then a reaction was carried out for 5 hours at room temperature. After completion of the reaction, chlorides produced in the reaction were filtered and removed by adding 100.00 g of diethylether, and the filtered solution was preserved at room temperature. Next, 200 g of diethylether and 500 g of water was added into the filtered solution again and then the diethylether layer was separated. The separated organic layer was extracted with 300 g of water three times, and the water layer was extracted with 50 g of diethylether and was added to the organic layer. The separated organic layer was dried with magnesium sulfate for one day, and then the organic solvent was removed using an evaporator to obtain the monomer represented by the following Formula 6a of pure yellow color. The yield of the product is 92%. {Mw=281.26, ¹H-NMR (CDCl₃): δ=1.93 (CH₃), 5.58 (H), 6.15 (H), 7.5 to 8.0 (6CH)}

[Formula 6a]

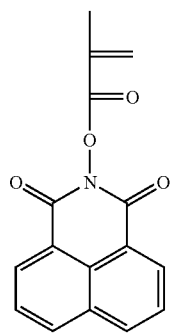

B) Preparation of Photosensitive Polymer of Formula 2a 300 mL of Tetrahydrofuran (THF) was added into a 500 mL 4-neck flask equipped with a refluxing cooler, a temperature controlling apparatus, and a nitrogen gas introducing apparatus, and was stirred for 30 minutes with adding a nitrogen. 28.21 g of monomer of the Formula 6a, 57.06 g of 4-acetoxystylene, 5.21 g of stylene, and 2.73 g of azobis (isobutyronitrile) (AIBN) were added, and the reactant was stirred at a temperature of 40° C. under a nitrogen atmosphere. After stirring, the temperature was elevated to 70° C., and the reactant was polymerized for 24 hours. After completion of the polymerization, the temperature was lowered to a room temperature, and the reactant was poured into 2 L of hexane to obtain the precipitates. Next, the obtained precipitates were filtered and washed with 2 L of hexane several times, and were vacuum dried. 300 mL of methanol and 50 mL of 30 weight % NH₄OH aqueous solution was added into the flask containing the dried polymer, and then the mixture was slowly stirred at a temperature of 50° C. to dissolve the dried polymer. After the polymer was completely dissolved, the mixture was additionally stirred for 30 minutes. The dissolved solution was poured into 1.5 L of water to obtain the precipitates. The obtained precipitates were filtered and washed with 2 L of pure water several times and vacuum dried for 2 days to obtain 65.82 g of the photosensitive polymer of the Formula 2a. The yield of the product was 72.75% {GPC analysis: Mw: 33,400, Pd: 1.79}. FIG. 1 is GPC (Gel Permeation Chromatography) graph of the photosensitive polymer represented by the Formula 2a. The synthesis process of the photosensitive polymer was represented in Reaction 1.

[Reaction 1]

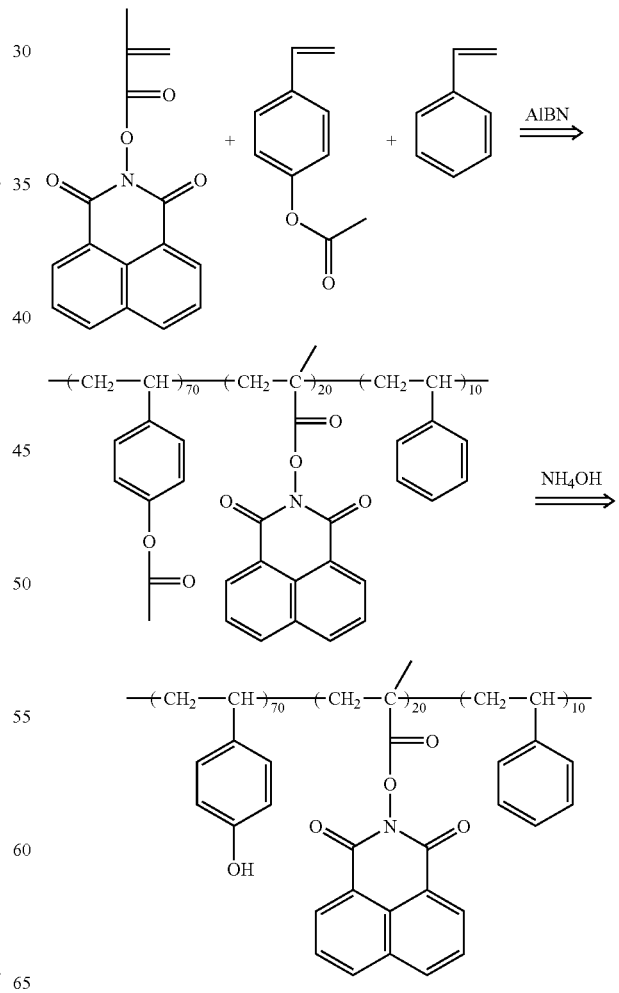

EXAMPLE 1-2

Preparation of Photosensitive Polymer of Formula 2b

A) Preparation of Monomer of the Following Formula 6b 200 g of tetrahydrofuran (THF) was added into a 500 ml 4-neck flask equipped with a mechanical stir as solvent. 33.95 g (0.3 mol) of cyclohexanonoxime was injected, and 31.37 g (0.31 mol) of triethylamine was slowly added, and then the mixture was stirred for 10 minutes at room temperature. After stirring, 32.41 g (0.31 mol) of methacyloyl chloride was slowly added into the mixture at a temperature of less than 20° C., and then the reaction was carried out for 5 hours at a room temperature. After completion of the reaction, chlorides produced in the reaction were filtered and removed by adding 100.00 g of diethylether, and the filtered water was preserved at room temperature. Next, 200 g of diethylether and 500 g of water was added into the filtered water again and then the diethylether layer was separated. The separated organic layer was extracted with 300 g of water three times, and the water layer was extracted with 50 g of diethylether and was added into the organic layer. The separated organic layer was dried with magnesium sulfate for one day, and then the organic solvent was removed using an evaporator to obtain monomer of the following Formula 6b of transparent color. The yield of the product was 92%. {Mw=181.23, $^1$H-NMR (CDCl$_3$): δ=1.3 to 1.5 (5CH$_3$), 1.93 (CH$_3$), 5.49 (H), 5.98 (H)}

[Formula 6b]

Figure 2:
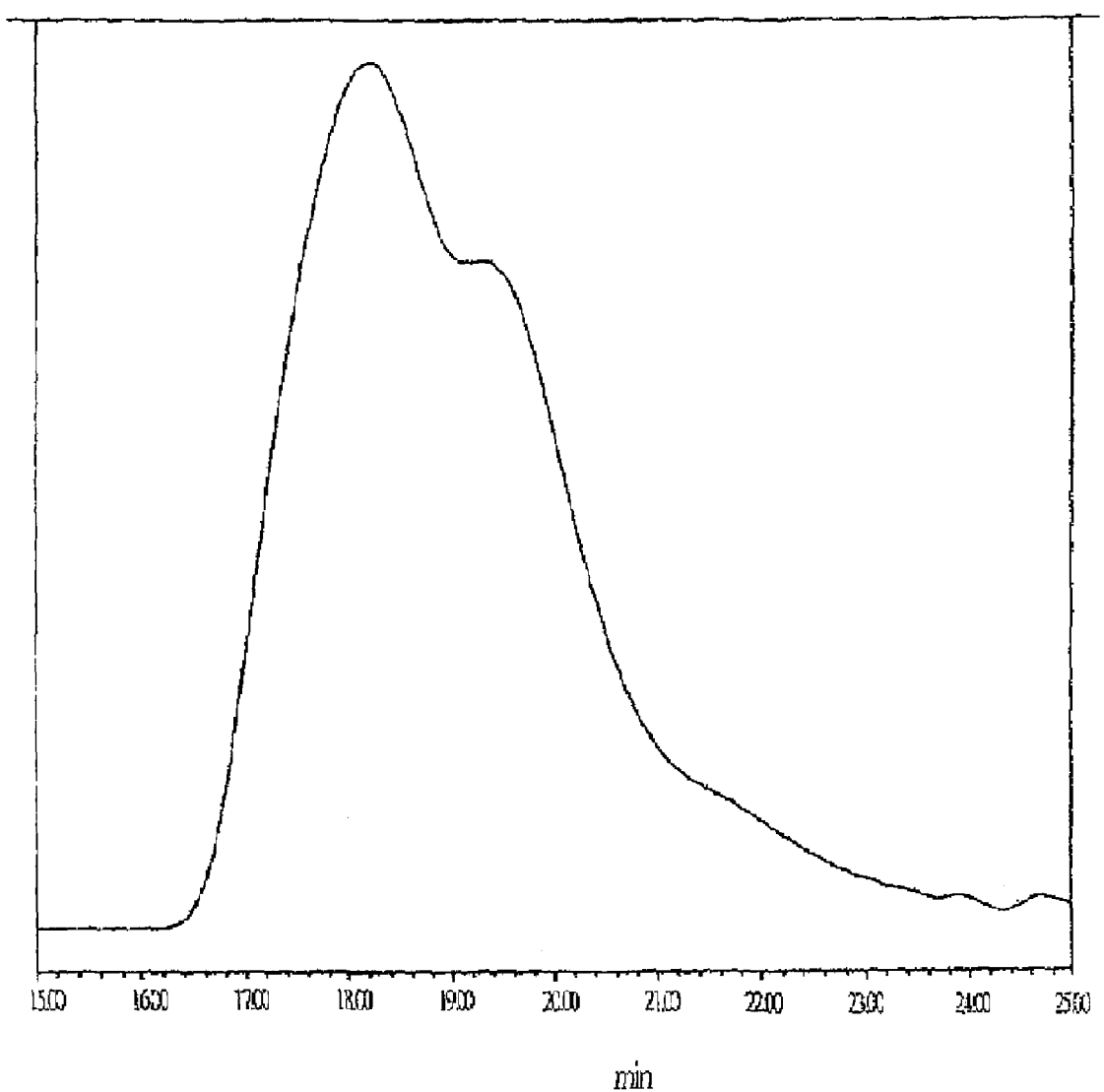

B) Preparation of Photosensitive Polymer of the Formula 2b 300 mL of Tetrahydrofuran (THF) was added into a 500 mL 4-neck flask equipped with a refluxing cooler, a temperature controlling apparatus, and a nitrogen gas introducing apparatus, and was stirred for 30 minutes with adding a nitrogen. 22.64 g of monomer of the Formula 6b, 57.06 g of 4-acetoxystylene, 8.52 g of gamma-butyrolactone methacylate, and 2.64 g of azobis(isobutyronitrile) (AIBN) were added, and the reactant was stirred at a temperature of 40° C. under a nitrogen atmosphere. After stirring, the temperature was elevated to 70° C., and the reactant was polymerized for 24 hours. After completion of the polymerization, the temperature was lowered to room temperature, and the reactant was poured into 3 L of hexane to obtain the precipitates. Next, the obtained precipitates were filtered and washed with 2 L of hexane several times, and were vacuum dried. 300 mL of methanol and 50 mL of 30 weight % NH$_4$OH aqueous solution was added into the flask containing the dried polymer, and the mixture was slowly stirred at a temperature of 50° C. to dissolve the dried polymer. After the polymer was completely dissolved, the mixture was additionally stirred for 30 minutes. The dissolved solution was poured into 1.5 L of water to obtain the precipitates. The precipitates were filtered and washed with 2 L of pure water several times and vacuum dried for 2 days to obtain 52.88 g of photosensitive polymer of the Formula 2b. The yield of the product was 59.94% {GPC analysis: Mw: 14,700, Pd: 2.22}. FIG. 2 is GPC (Gel Permeation Chromatography) graph of a photosensitive polymer represented by the Formula 2b. The synthesis process of the photosensitive polymer of the Formula 2b was represented in Reaction 2.

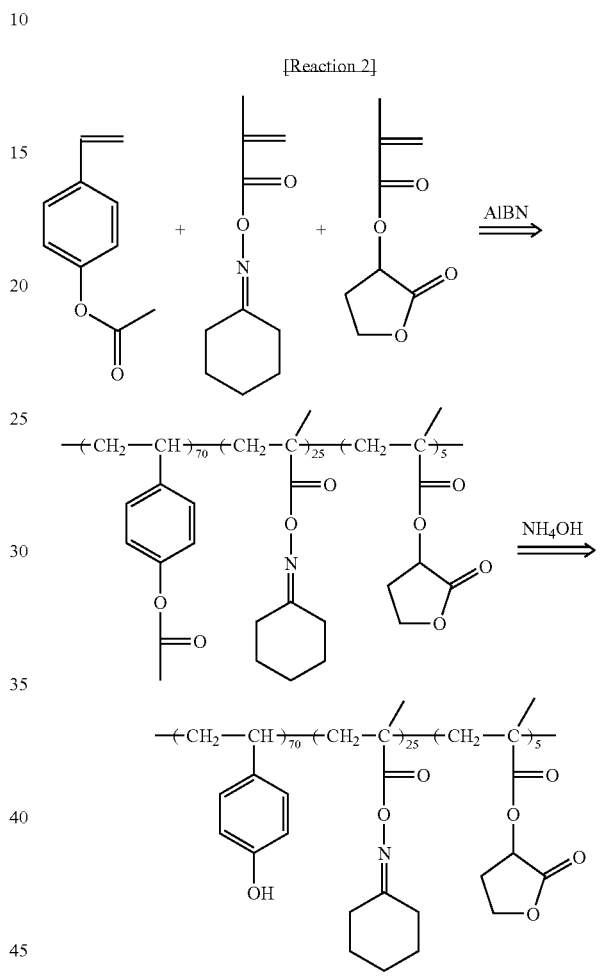

[Reaction 2]

EXAMPLES 2-1 TO 2-2

Preparation of Photoresist Composition Including Photosensitive Polymer Prepared in Examples 1-1 to 1-2

2.5 g of photosensitive polymer (Formula 2a) prepared in the Example 1-1, 0.08 g of triphenylsulfonium triflate, and 0.03 g of triethanolamine were dissolved in 30 g of propyleneglycolmonomethyl etheracetate (PGMEA), and then a photoresist composition was prepared by filtering the mixture with a filter of 0.20 μm pore size. Except for adding 2.5 g of photosensitive polymer (Formula 2b) prepared in the Example 1-2 instead of 2.5 g of the photosensitive polymer prepared in the Example 1-1, a photoresist composition was prepared in the same manner described in Example 2-1 (Example 2-2).

COMPARATIVE EXAMPLE 1

Preparation of Photoresist Composition Including Photosensitive Polymer Represented by the Following Formula 7

2.5 g of photosensitive polymer (Mw: 21,500, Pd: 2.01) of the following Formula 7, 0.08 g of triphenylsulfonium triflate, and 0.03 g of triethanolamine were dissolved in 30 g of propyleneglycolmonomethyl etheracetate (PGMEA), and then a photoresist composition was prepared by filtering the mixture with a filter of 0.20 μm pore size.

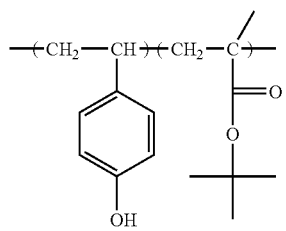

[Formula 7]

EXAMPLES 3-1 TO 3-2, COMPARATIVE EXAMPLE 2

Formation of Photoresist Pattern

The photoresist composition prepared in the Examples 2-1 and 2-2 and Comparative Example 1 were spin coated on the upper parts of the to-be-exposed layer of silicon wafers being used in hexamethyl disiloxane (HMDS) with 0.8 μm thickness to prepare a thin-film of photoresist. The photoresist layer was pre-baked at a temperature of 100° C. (or 120° C.) for 90 seconds in a oven or on a hot plate, and was exposed with a KrF laser apparatus having numerical aperture of 0.5 under optical exposure energy (EOP), and then was post-baked at a temperature of 100° C. (or 120° C.) for 90 seconds. Thereafter, the baked wafer was developed with 2.38 weight % of tetra-methylammonium hydroxide (TMAH) solution for about 30 seconds to form a uniform line/space pattern of 0.2 μm. Line width variation of the obtained pattern were measured and are set forth in the following Table 1.

TABLE 1

| | Resolution(nm) | Line width variation(nm) |
|---|---|---|
| Example 3-1 (Formula 2a) | 200 | 3.5 |
| Example 3-2 (Formula 2b) | 200 | 3.8 |
| Comparative Example 2 (Formula 7) | 200 | 4.5 |

As shown in Table 1, the photoresist composition including the photosensitive polymer (Formula 2a and 2b) according to the present invention has a good line with stability compared to the photoresist composition including the conventional chemically amplified photosensitive polymer (Formula 7), in exposure light source of KrF laser.

EXAMPLES 4-1 TO 4-2, COMPARATIVE EXAMPLE 3

Formation of Photoresist Pattern

Except for using silicon wafers used in hexamethyl disiloxane (HMDS) with 0.1 μm thickness and a EUV exposure apparatus instead of silicon wafers being used in hexamethyl disiloxane (HMDS) with 0.8 μm thickness and a KrF laser exposure apparatus, a uniform line/space pattern of 50 nm was formed in the same manner described in Example 3-1. Line width variations of the obtained pattern were measured and are set forth in the following Table 2.

TABLE 2

| | Resolution(nm) | Line width variation(nm) |
|---|---|---|
| Example 4-1 (Formula 2a) | 50 | 3.6 |
| Example 4-2 (Formula 2b) | 50 | 4.0 |
| Comparative Example 3 (Formula 7) | 50 | 5.1 |

As shown in Table 2, the photoresist composition including the photosensitive polymer (Formula 2a and 2b) according to the present invention has a good line with stability compared to the photoresist composition including the conventional chemically amplified photosensitive polymer (Formula 7), in exposure light source of EUV.

As described above, a photosensitive polymer according to the present invention and a photoresist composition including the same, has a advantage that line width variation of a pattern is stable compared to the conventional resist which is chemically amplified to obtain a fine pattern, in case of exposure light source of extreme UV and deep UV.

The invention claimed is:

1. A photosensitive polymer for extreme UV and deep UV including a repeating unit represented by the following Formula 1,

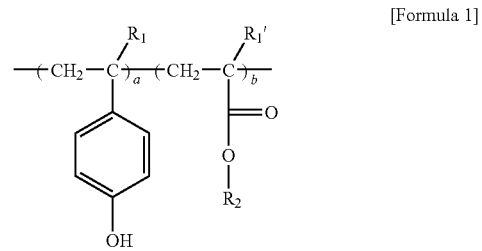

[Formula 1]

in Formula 1, $R_1$ and $R_1'$ are independently a hydrogen atom, methyl group, or trifluoromethyl group, and $R_2$ is

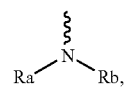

wherein Ra and Rb are independently alkyl group of 1 to 10 carbon atoms, aryl group of 6 to 10 carbon atoms, or arylalkyl group of 7 to 12 carbon atoms, and can be connected together to form a ring, and a and b are mol % of each repeating unit with respect to the total repeating unit constituting the photosensitive polymer, and are 1 to 99 mol % and 1 to 99 mol % respectively.

2. The photosensitive polymer according to claim 1, wherein $R_2$ is selected from the group consisting of

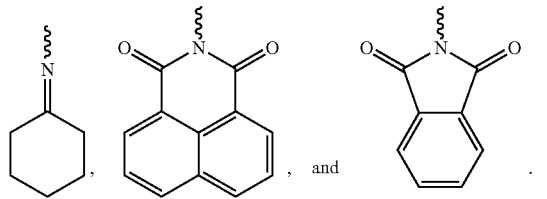

3. A photosensitive polymer for extreme UV and deep UV, wherein the photosensitive polymer is represented by the following Formula 2,

[Formula 2]

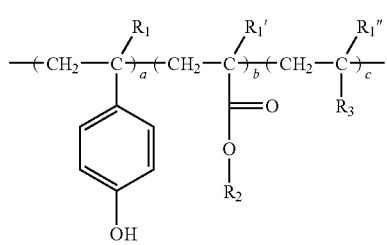

in Formula 2, $R_1$, $R_1'$ and $R_2$ are same as defined in Formula 1, and $R_1''$ is a hydrogen atom, methyl group, or trifluoromethyl group, and $R_3$ is hydrocarbon group of 4 to 22 carbon atoms or ester group, and a, b and c are mol % of each repeating unit with respect to the total repeating unit constituting the photosensitive polymer, and are 1 to 98 mol %, 1 to 98 mol %, and 1 to 98 mol % respectively.

4. The photosensitive polymer according to claim 3, wherein the $R_3$ is selected the group consisting of

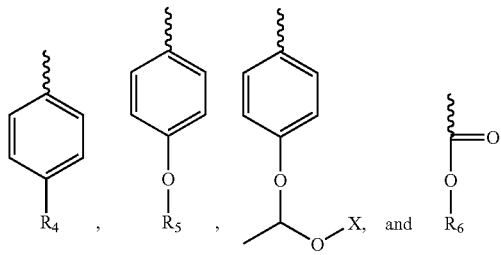

(here, $R_4$ is a hydrogen atom or alkyl group of 1 to 10 carbon atoms, $R_5$ is alkyl group of 1 to 10 carbon atoms, X is alkyl group of 1 to 10 carbon atoms or aryl group of 6 to 10 carbon atoms, and $R_6$ is hydrocarbon group of 3 to 21 of carbon atoms).

5. The photosensitive polymer according to claim 3, the photosensitive polymer is represented by the following Formula 2a or 2b,

[Formula 2a]

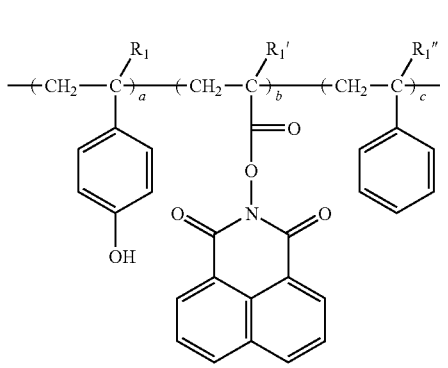

[Formula 2b]

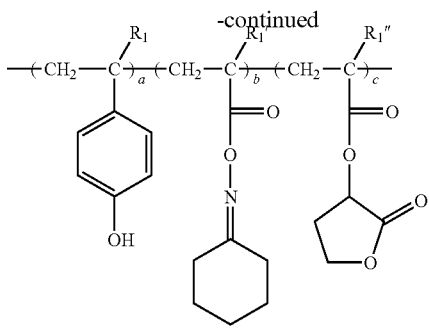

in Formula 2a and 2b, $R_1$, $R_1'$, $R_1''$, a, b, and c are same as defined in Formula 2.

6. A photoresist composition including the photosensitive polymer according to claim 1, and an organic solvent.

7. The photoresist composition according to claim 6, wherein the amount of the photosensitive polymer is 0.1 to 30 weight % with respect to the total photoresist composition.

8. The photoresist composition according to claim 6, wherein the photoresist composition further includes a photoacid generator and the amount of the photo-acid generator is from 0.1 to 20 weight parts for 100 weight parts of the photosensitive polymer.

9. The photoresist composition according to claim 6, wherein the organic solvent is selected from the group consisting of ethyleneglycol monomethylethyl, ethyleneglycol monoethylether, ethyleneglycol monomethylether, diethyleneglycol monoethylether, propyleneglycol monomethyletheracetate (PGMEA), toluene, xylene, methylethylketone, cyclohexanone, ethyl-2-hydroxy propionate, ethyl 2-hydroxy-2-methyl propionate, ethoxyethyl acetate, hydroxyethyl acetate, methyl 2-hydroxy-3-methylbutanoate, methyl 3-methoxy-2-methylpropionate, ethyl 3-ethoxy propionate, ethyl 3-methoxy-2-methylpropionate, ethyl acetate, butyl acetate and the mixtures thereof.

10. The photoresist composition according to claim 8, wherein the photo-acid generator is selected from the group consisting of phthalimido trifluoromethane sulfonate, dinitrobenzyltosylate, n-decyl disulfone, naphthylimido trifluoromethane sulfonate, diphenyliodonium hexafluorophosphate, diphenyliodonium hexafluoroarsenate, diphenyliodonium hexafluoroantimonate, diphenylparamethoxyphenylsulfonium triflate, diphenylparatoluenylsulfonium triflate, diphenylpara-isobutyl phenylsulfonium triflate, triphenylsulfonium hexafluoroarsenate, triphenylsulfonium hexafluoro antimonate, triphenylsulfonium triflate, dibutylnaphthylsulfonium triflate and the mixtures thereof.

11. A method of forming a photoresist pattern comprising the steps of;

forming a photoresist layer by applying a photoresist composition including a photosensitive polymer including the repeating unit of the following Formula 1 and an organic solvent on a substrate;

forming a predetermined photoresist pattern by exposing the photoresist layer to a light source; and developing the exposed photoresist layer,

[Formula 1]

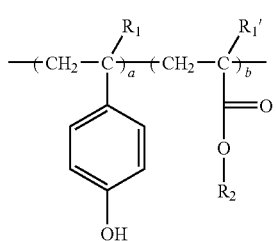

in Formula 1, $R_1$ and $R_1'$ are independently a hydrogen atom, methyl group, or trifluoroethyl group, and $R_2$ is

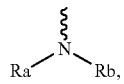

wherein Ra and Rb are independently alkyl group of 1 to 10 carbon atoms, aryl group of 6 to 10 carbon atoms, or arylalkyl group of 7 to 12 carbon atoms, and can be connected together to form ring, and a and b are mol % of each repeating unit with respect to the total repeating unit constituting the photosensitive polymer, and are 1 to 99 mol % and 1 to 99 mol % respectively.

12. The method of forming the photoresist pattern according to claim 11, wherein the photoresist composition further includes a photo-acid generator.

* * * * *